US007583010B1

(12) United States Patent
Goodemote

(10) Patent No.: US 7,583,010 B1
(45) Date of Patent: Sep. 1, 2009

(54) HYBRID TRANSDUCER

(75) Inventor: John H. Goodemote, Oneida, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 16 days.

(21) Appl. No.: 11/566,383

(22) Filed: Dec. 4, 2006

(51) Int. Cl.
*H01L 41/08* (2006.01)

(52) U.S. Cl. ...................................... 310/334; 310/329

(58) Field of Classification Search ................. 310/322, 310/323.21, 325, 329, 334, 337, 344
See application file for complete search history.

(56) References Cited

U.S. PATENT DOCUMENTS

| | | | | | |
|---|---|---|---|---|---|
| 2,906,991 | A | * | 9/1959 | Camp | 367/155 |
| 2,961,637 | A | * | 11/1960 | Camp | 367/158 |
| 3,328,751 | A | | 6/1967 | Massa | |
| 3,329,408 | A | * | 7/1967 | Garver | 366/114 |
| 3,370,186 | A | * | 2/1968 | Antonevich | 310/325 |
| 3,778,578 | A | * | 12/1973 | Long et al. | 219/687 |
| 4,443,731 | A | | 4/1984 | Butler et al. | |
| 4,555,945 | A | * | 12/1985 | Hanson | 73/497 |
| 4,633,119 | A | * | 12/1986 | Thompson | 310/325 |
| 4,728,845 | A | | 3/1988 | Haun et al. | |
| 5,334,903 | A | | 8/1994 | Smith | |
| 5,340,510 | A | | 8/1994 | Bowen | |
| 5,483,502 | A | * | 1/1996 | Scarpitta et al. | 367/158 |
| 5,515,342 | A | * | 5/1996 | Stearns et al. | 367/155 |
| 5,844,349 | A | * | 12/1998 | Oakley et al. | 310/358 |
| 5,869,767 | A | * | 2/1999 | Hayward et al. | 73/774 |
| 5,875,154 | A | * | 2/1999 | Dechico | 367/163 |
| 6,690,621 | B2 | * | 2/2004 | Porzio | 367/158 |
| 6,776,762 | B2 | * | 8/2004 | Erikson et al. | 600/459 |
| 6,984,923 | B1 | | 1/2006 | Walsh et al. | |
| 7,053,531 | B2 | | 5/2006 | Chisaka et al. | |
| 7,109,642 | B2 | * | 9/2006 | Scott | 310/334 |

OTHER PUBLICATIONS

Analyses and Measurements of Acoustically Matched, Air-Coupled Tonpilz Transducers, 1999 IEE Ultrasonics symposium proceedings.

* cited by examiner

*Primary Examiner*—Thomas M Dougherty
(74) *Attorney, Agent, or Firm*—William Greener; Bond, Schoeneck & King, PLLC

(57) ABSTRACT

An embodiment of the invention is directed to a hybrid geometry type acoustic transducer. A hybrid geometry type acoustic transducer as embodied herein leverages different type transducer physical configurations. More specifically, embodiments of the hybrid transducer combine specific features of traditional Tonpilz resonators and PZT-composite transducers to exploit the beneficial characteristics of both. The outward construction of an embodied hybrid transducer mimics a Tonpilz resonator incorporating a headmass and a tailmass sandwiching a piezoelectric active material. However, rather than using a conventional ceramic ring stack or plate form of active material, a layer of diced or "pillared" active material is provided between the headmass and the tailmass with no filler material other than a gas, such as air, for example, or others, or a vacuum environment. Acoustic projectors constructed using this invention benefit with higher bandwidth and efficiency due to coupling loss that is lower than in prior designs. Likewise, when a hydrophone is constructed using aspects of this invention, exceptional hydrophone figure of merits are obtained. A method for making a hybrid transducer is described.

29 Claims, 7 Drawing Sheets

HYBRID TRANSDUCER

This invention was made with government support under Contract No. N00024-04-C-6232 awarded by the U.S. Department of the Navy. The government has certain rights in the invention.

BACKGROUND OF THE INVENTION

1. Field of the Invention

Embodiments of the invention are generally directed to the field of acoustic transducers. More particularly, embodiments of the invention are directed to a hybrid geometry piezoelectric transducer and methods for making such a transducer.

2. Description of Related Art

Electromechanical transducers are used for the interconversion of electrical and mechanical energy. In acoustic applications, these include, but are not limited to, microphones, speakers, underwater projectors, hydrophones, sonar, sonic cleaning and imaging, and weaponry. In a typical solid-state transducer, the acoustically active element is made from a piezoelectric ceramic material such as lead zirconate titanate (PZT), an electrostrictive ceramic such as lead magnesium niobate (PMN), a magnetostrictive metal alloy such as Terfenol-D, or other similar active material. (See, e.g., B. Jaffe et al., *Piezoelectric Ceramics*, Academic Press, London, N.Y., 1971 and http://www.etrema.com/core/terfenold).

Two common, albeit dissimilar, types of acoustic transducers are resonant transducers such as the Tonpilz electroacoustic transducer and non-resonant, bulk-mode PZT composite transducers.

The basic configuration of the modern Tonpilz transducer is disclosed in Massa U.S. Pat. No. 3,328,751 and is illustrated in FIG. 1. The Tonpilz resonator includes a stack of a piezoceramic (PZT) material (e.g. annular pieces, rings) bolted together in a prestressed condition between a relatively massive tailmass and a relatively lighter, flared headmass. For a more in-depth description, the interested reader is directed to, e.g., O. B. Wilson, *Introduction to Theory and Design of Sonar Transducers, ch.* 6, Peninsula Publishing, Los Altos, Calif., 1991, the disclosure of which is incorporated herein by reference in its entirety to the fullest allowed extent.

PZT composite type transducers, typically referred to as 1-3 composites or 2-2 composites, are geometrically configured differently than the Tonpilz type resonator. The 1-3 composite transducer has a one-dimensionally connected ceramic phase (e.g., PZT columns or pillars) contained within a three-dimensionally-connected matrix provided by an organic polymer phase. A schematic illustration of a basic transducer of this type is shown in FIG. 2. The 2-2 composite transducer comprises two-dimensionally-connected strips of PZT ceramic separated by two-dimensionally-connected parallel strips of polymer. This configuration is widely used in phased array type ultrasound transducers. For more detail regarding the implementation and process of manufacture of composite transducers, the interested reader is directed to, e.g., U.S. Pat. Nos. 4,728,845; 5,334,903; and 5,340,510, the disclosures of which are incorporated herein by reference in their entireties to the fullest allowed extent.

Another type of transducer is a hybrid material transducer in which active electrostrictive and magnetostrictive transducer materials are intimately combined in a unitary transducer construction. In this type of hybrid transducer, the mixture of two dissimilar active materials provides electrical and mechanical advantages not available to a single transducer type. The interested reader is directed to, e.g., Butler et al., U.S. Pat. No. 4,443,731, the disclosure of which is incorporated herein by reference in its entirety to the fullest allowed extent.

Each of these different types of transducers have various advantages and disadvantages depending upon their applications, as well as limitations and tradeoffs that affect their ultimate performance. Special considerations are directed to transducer size, weight, strength, environmental and operational durability, operating frequency, sensitivity, noise performance, radiation response and directionality, baffling, cost, and other physical, structural and performance related attributes well recognized by persons skilled in the art.

More particularly, for example, resonant transducers like the Tonpilz type can provide high sensitivity and high output, but typically at a reduced bandwidth and not constant across frequency. In addition, the wide variation of electrical impedance near resonance can pose design challenges and require certain compromises. Furthermore, a Tonpilz resonator requires a bulky headmass that is subject to unwanted deformation and other known issues.

Traditional composite transducers use elastomeric filler between ceramic rods or posts. Although the elastomeric filler provides increased strength, transducers built from composites (such as 1-3 ceramic) tend to suffer from reduced sensitivity as well as vibro-acoustic crosstalk due to the composite filler material. For a transducer of a given size, the presence of filler material decreases the effective compliance and lowers output and sensitivity. Methods to counteract this problem have been demonstrated. Some methods have included using gas-voided polymers as a fill material to reduce the shear wave velocity and increase compliance. Another example is the negative Poisson ratio polymers proposed by Smith (e.g., U.S. Pat. No. 5,334,903); however, both these methods are inherently narrowband, temperature dependent, and can exacerbate the problems caused by lateral resonances. Lateral resonances could be broadly defined as undesirable or deleterious vibrational or acoustical propagation normal to the preferred transducing direction. These resonances can occur from the presence of the filler and consequently generate non-uniformity in the frequency response. Through general reciprocity and the act of transduction, the non-uniformities propagate to all inputs and outputs of the device, appearing in the mechanical, electrical, and acoustical frequency responses. Along the same lines, fillers tend to make sensors constructed in this manner sensitive to sound coming from the wrong direction. Various methods to block orthogonal signals using absorptive materials or baffles can be employed, which may incur system cost and weight penalties. Moreover, composite fillers are generally made from elastomers like rubber or polyurethane, whose properties are usually highly dependent on temperature. Changes in temperature may result in unacceptable changes in key performance attributes resulting from changes in material compliance, sound speed, and other properties. Another disadvantage of transducers fabricated from composites (as well as those built using hollow ceramic cylinder or sphere configurations) is that they often are necessarily made structurally weak in order to obtain high sensitivity. FIGS. 3(*a-d*) show comparative graphs of hydrophone receive sensitivity of several different transducer configurations. With a similar volume of active material, a Tonpilz-style device shows some clear advantages in sensitivity. Designs with omni-directional (or multipole-like) radiation responses can less effectively discriminate against noise and other interferers without using several transducers in an array configuration. Typically, spherical designs produce omni-directional responses and composites have a dipole or quadrupole-like response that corresponds to the primary and secondary axis in the material. As a consequence, they incorporate bulky acoustic baffling or may use multiple sensors to achieve a directional response. FIGS. 4(*a-d*) show comparative sensing footprints of several different types of transducers.

In view of all of the foregoing considerations and others that are appreciated by persons skilled in the art, the inventor has recognized a need for an acoustic transducer design, construction, and method for making that address the known shortcomings of conventional transducers and provide improvements over the various attributes of the conventional transducer types mentioned above.

SUMMARY OF THE INVENTION

An embodiment of the invention is directed to a hybrid geometry type acoustic transducer. A hybrid geometry type acoustic transducer as embodied herein leverages different type transducer physical configurations. More specifically, embodiments of the hybrid transducer described herein combine specific features of traditional Tonpilz resonators and PZT-composite transducers to exploit the beneficial characteristics of both. The outward construction of an embodied hybrid transducer mimics a Tonpilz resonator incorporating a headmass and a tailmass sandwiching a piezoelectric active material. However, rather than using a conventional ceramic ring stack or plate form of active material, a layer of diced or "pillared" active material is provided between the headmass and the tailmass with no filler material other than a gas, such as air, for example, or others, or a vacuum environment. According to an aspect, a multiplicity of pillar elements are integrally formed from a base of selected active material. This unit may be referred to herein as the diced ceramic element. The diced ceramic element is inverted so that the ceramic substrate supporting the pillars becomes the principle part of a headmass of the transducer. This unique feature allows for reduced headmass size and weight and increased rigidity, all contributing to improve acoustic performance. A tailmass is cemented to the free end of the ceramic pillars thus anchoring them at both ends and providing a strength increase over conventional diced ceramic element designs. Due to the overall increased strength, the inter-pillar region in the element need not be occupied to any extent with a compliant material as is done with conventional composite type transducers. When only a gas or a vacuum occupies the inter-pillar space, deleterious acoustic signals are prevented from propagating laterally within the device making it more immune to acoustic (and vibratory) interferers that are not directed along the device sensing axes (i.e., the $x_3$ dimension). The design provides the embodied hybrid transducer with potentially small size and cross-sectional area to allow for tight spacing in arrays or for greater distances between edges of adjacent transducers, thus reducing their mutual impedance and its associated negative consequences. Although the term diced ceramic element is used herein to describe the pillar-like structure of the active element, according to various aspects the pillar elements can be fabricated by injection molding and/or other known forming techniques, as well as by cutting or dicing with a saw, as is well known in the art. It will also be appreciated by a person of skill in the art that electrodes and appropriate input/output electrical connections will be components of any operational transducer.

According to another embodiment, a method of making a hybrid transducer includes providing an active material consisting of a low defect type of Lead Zirconate Titanate (PZT) ceramic having selected dimensions; forming a plurality of pillar elements in spaced relation in the active material; and attaching a tailmass to a free end region of the plurality of pillar elements, wherein no solid or liquid material is provided in the inter-pillar space. In a particular aspect, the plurality of pillar elements are formed integrally with a substrate region of the active material. In this manner, the non-pillared mass of active ceramic material can serve as a headmass for the transducer, which provides a Tonpilz-like geometry characteristic to the transducer. As mentioned above, appropriate electrical connections will be incorporated as part of the process for making the hybrid transducer. The active material may also be electrically polled, as necessary, in the $x_3$ direction of the pillars.

It can thus readily be seen that the embodiments of the invention generally combine the geometrical characteristics of a Tonpilz resonator in the form of a headmass and a tailmass sandwiching an active piezo material while also utilizing the multiple pillar geometry of 1-3 composite transducers absent any solid or liquid filler. Among other benefits, the embodied hybrid transducer can be made to be smaller, lighter and more efficient than either of the aforementioned transducer types.

The foregoing and other objects, features, and advantages of embodiments of the present invention will be apparent from the following detailed description of the preferred embodiments, which makes reference to several drawing figures.

DETAILED DESCRIPTION OF A PREFERRED EMBODIMENT OF THE INVENTION

Figure 1:
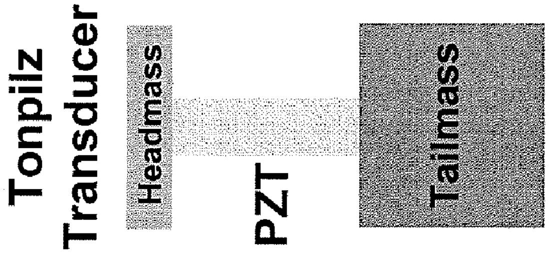
FIG. 1 is a block schematic diagram illustrative of a basic Tonpilz resonator geometry.
Figure 2:
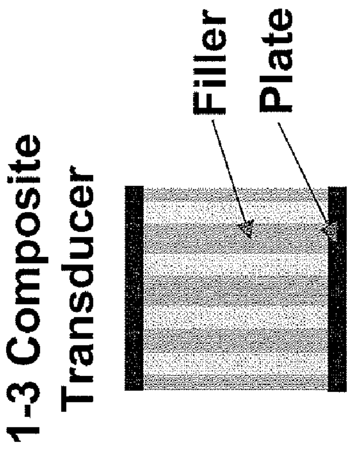
FIG. 2 is a block schematic diagram illustrative of a basic 1-3 composite geometry.
Figure 3A:
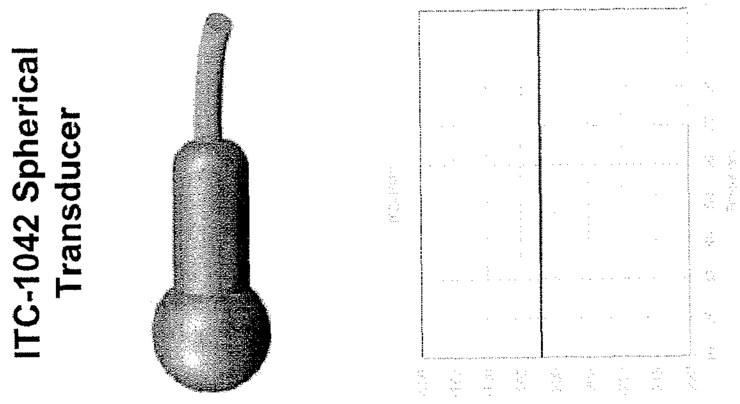
FIGS. 3*a-d* are comparative graphs of transducer sensitivity for different types of transducers.
Figure 3B:
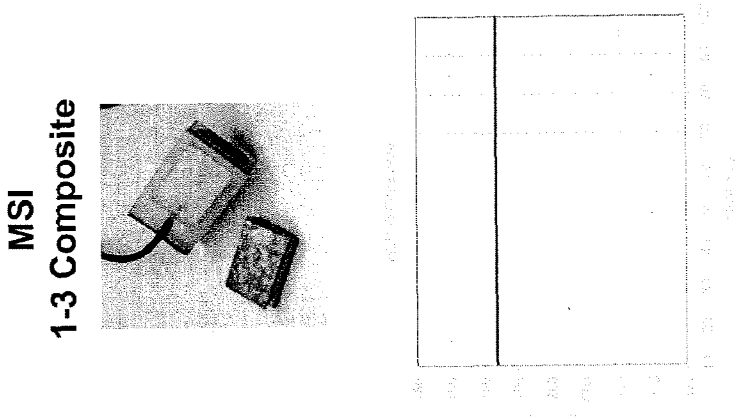
Figure 3C:
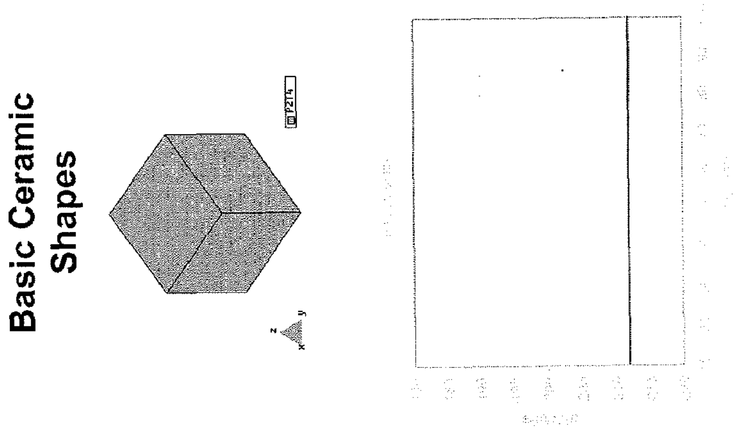
Figure 3D:
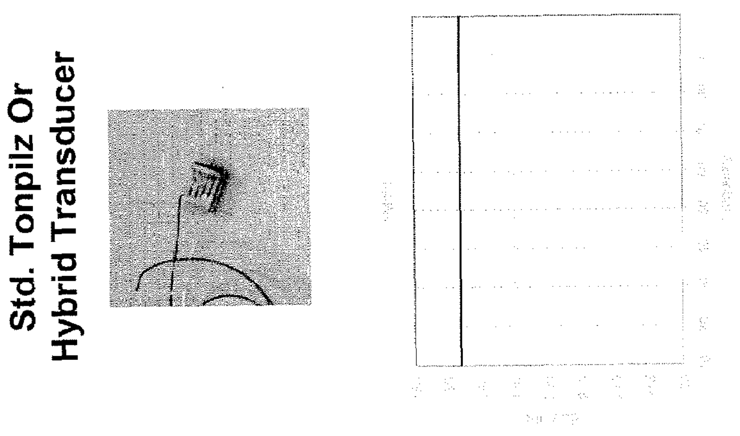
Figures 4A, 4B, 4C, 4D:
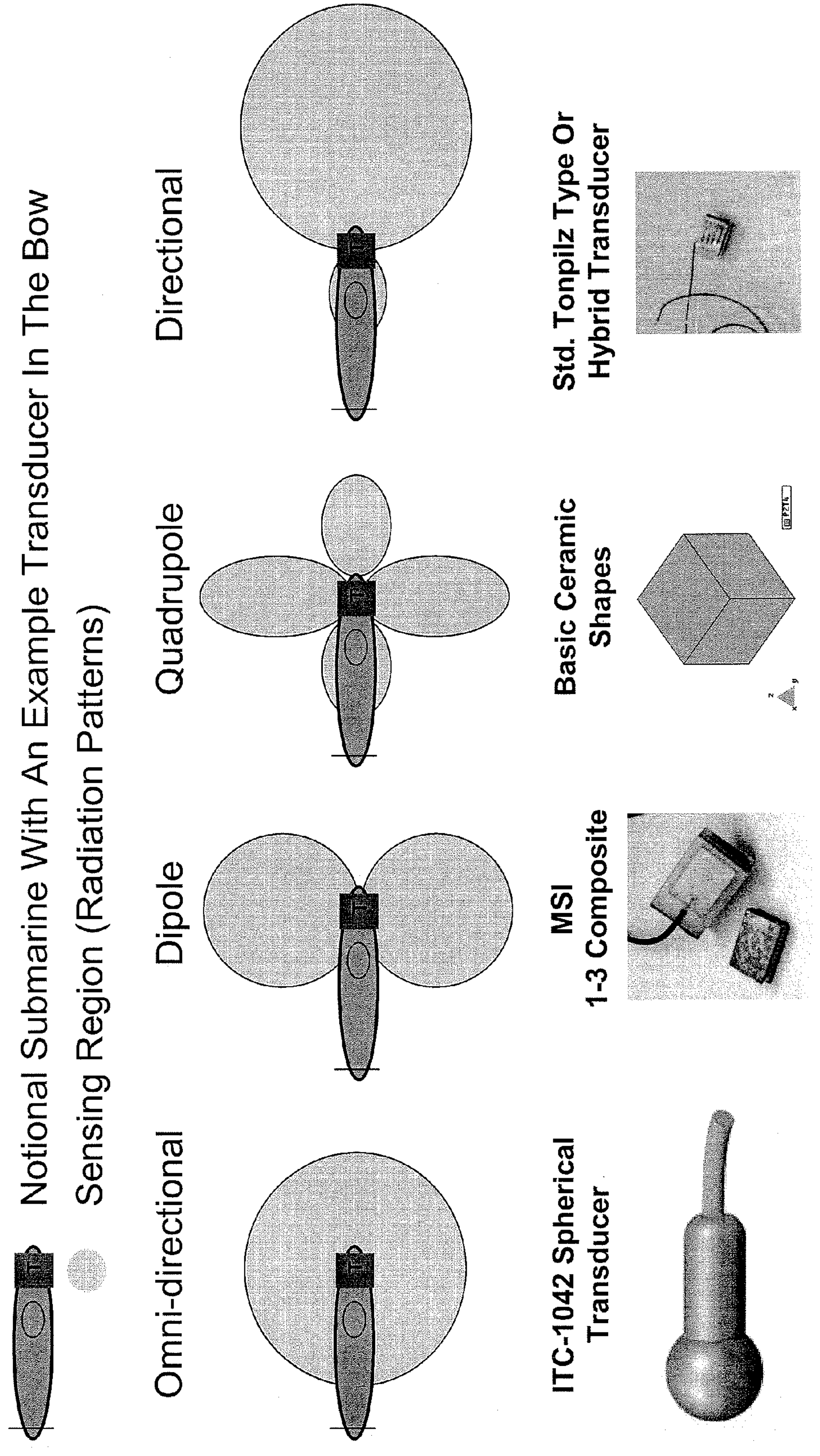
FIGS. 4*a-d* are diagrams of comparative sensing footprints for different types of transducers.
Figure 5:
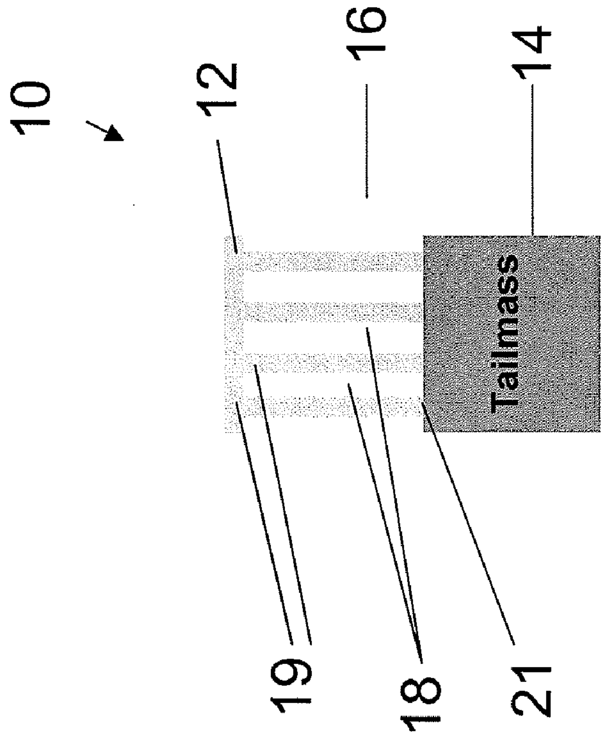
FIG. 5 shows a schematic elevational view of a hybrid transducer according to an embodiment of the invention.

FIG. 5 is a schematic elevational view of a hybrid transducer 10 according to an embodiment of the invention. The hybrid transducer 10 includes a headmass 12, a tailmass 14 and an active structure 16 disposed intermediate the headmass 12 and the tailmass 14. The active structure 16 is a low defect, high dielectric, modified PZT-5H type ceramic material that can be obtained commercially from sources such as TRS Technologies (State College, Pa.) or Lockheed Martin Company (Syracuse, N.Y.). While a high dielectric material such as PZT-5H type is desirable for an embodiment of the invention, other active materials may be employed. For example, it is recognized that higher figures of merit for hydrophone and acoustic projectors may be obtained for certain transducer configurations by using ceramics like PZT-4 and PZT-8, respectively. The particular choice of active material, being dependant on the transducer's mode of operation and its physical geometry, will be apparent to those skilled in the art. However, for ease of manufacture and structural integrity, the material is beneficially a low-defect type. PZT-5H is employed in a particular aspect due to its high dielectric constant. The proportionally higher dielectric constant facilitates a proportionally smaller transducer which is beneficial in compact, high frequency designs. The active material is formed to have a plurality of pillar elements 18 in spaced relation. According to a particularly advantageous aspect, each pillar element 18 is integrally formed from a suitably prepared ceramic substrate. Therefore, one end region 19 of each pillar is integral with the non-pillared portion of the substrate, which becomes the headmass 12 of the transducer. In one aspect of the invention, the pillars are equally spaced from one another so that load is uniformly distributed across the face of the headmass of the transducer. The other end region 21 of each pillar 18 (the free end) is coupled to the tailmass 14. The tailmass 14 may suitably be any material of high acoustic impedance such as, e.g., stainless steel or tungsten. The tailmass is attached to the free ends of the ceramic pillar elements 18 using a silver-based conductive epoxy or other suitable substance known in the art. No solid or liquid material is introduced into the space between the pillars and the headmass and tailmass. Thus only a gaseous medium or a vacuum occupies the space intermediate the pillar elements.

Figure 6:
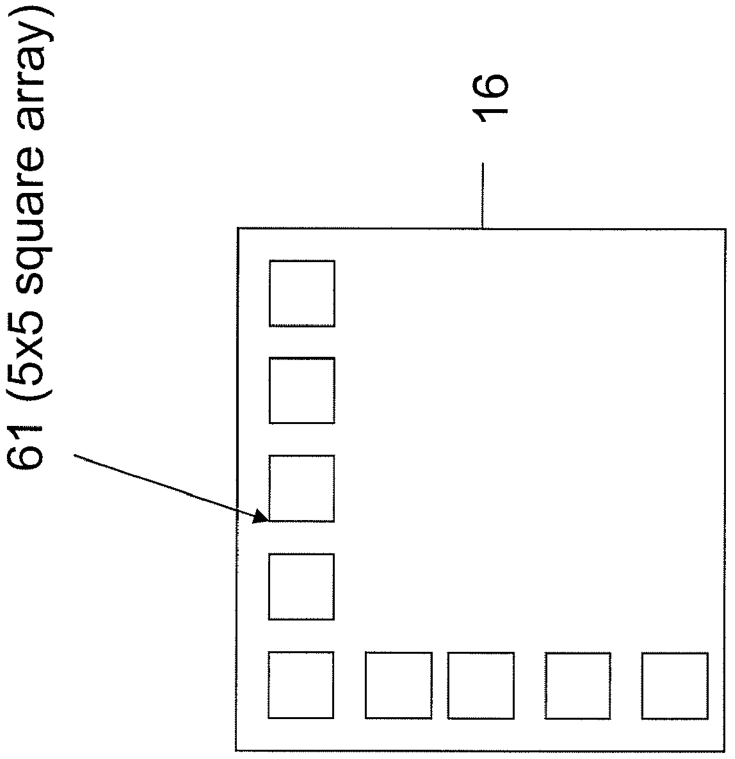
FIG. 6 shows a schematic top plan view of an inverted diced ceramic element in a square grid array according to an embodiment of the invention.
Figure 8:
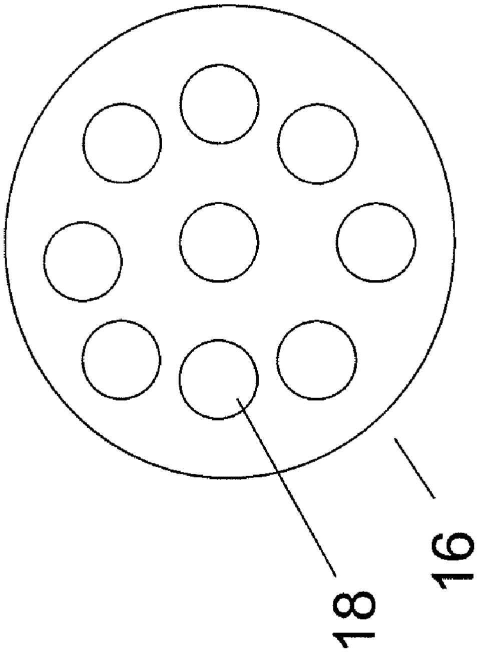
FIG. 8 shows a schematic top plan view of an inverted diced ceramic element in an arcuate grid array according to an aspect of the invention.
Figure 7:
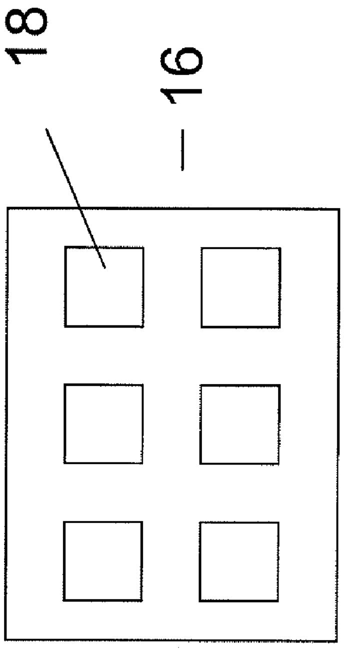
FIG. 7 shows a schematic top plan view of an inverted diced ceramic element in a rectangular grid array according to an aspect of the invention.

According to a particular aspect, a plurality of pillars 18 are formed by cutting the ceramic substrate with a diamond blade saw. Using this or other known methods and apparatus such as injection molding, for example, an array of pillars are formed as shown in FIG. 6. As shown in FIG. 6, the pillar elements form a 5×5 square grid 61 of evenly spaced elements. A 3×3 grid is contemplated as the minimum grid array size. Other grid geometries such as rectangular, as shown in FIG. 7, having at least a 2×3 grid and, arcuate, as shown in circular form in FIG. 8, having at least four pillar elements may also be created. In a single transducer, practical application of grid arrays up to 200×200 pillars is contemplated. Devices appreciably larger will use a multiplicity of transducers in an array configuration rather than increasing the size of a single transducer.

Figure 9:
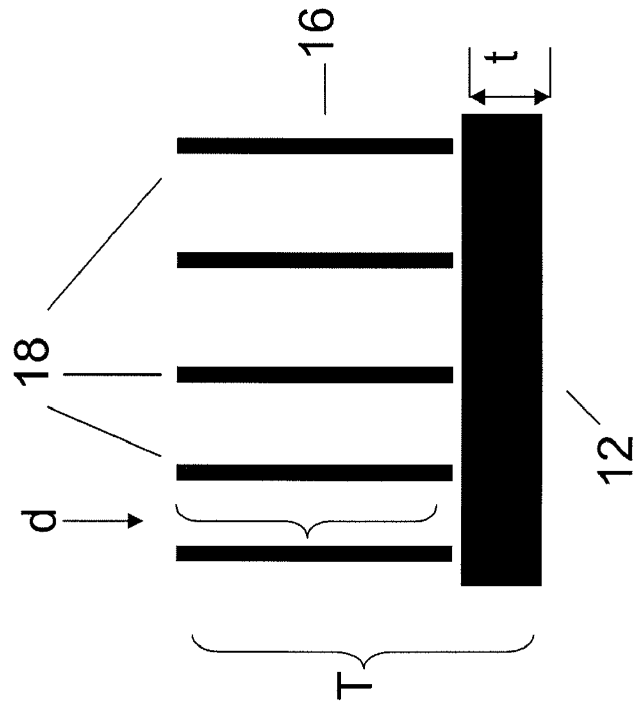
FIG. 9 shows a cross sectional elevational view of an inverted diced ceramic element of a hybrid transducer according to an embodiment of the invention.

According to aspects of the invention, each of the plurality of pillar elements 18 has a cross sectional area in the range between about 0.010 to 50 square inches. With reference to FIG. 9, the depth, d, of the inter-pillar space should be about 75% to 98% of a total thickness, T, of the active material. Alternatively, the ratio of a thickness of a pillared region of the active material to the space intermediate the plurality of pillar elements should be between 0.1 and 0.7.

Figure 10:
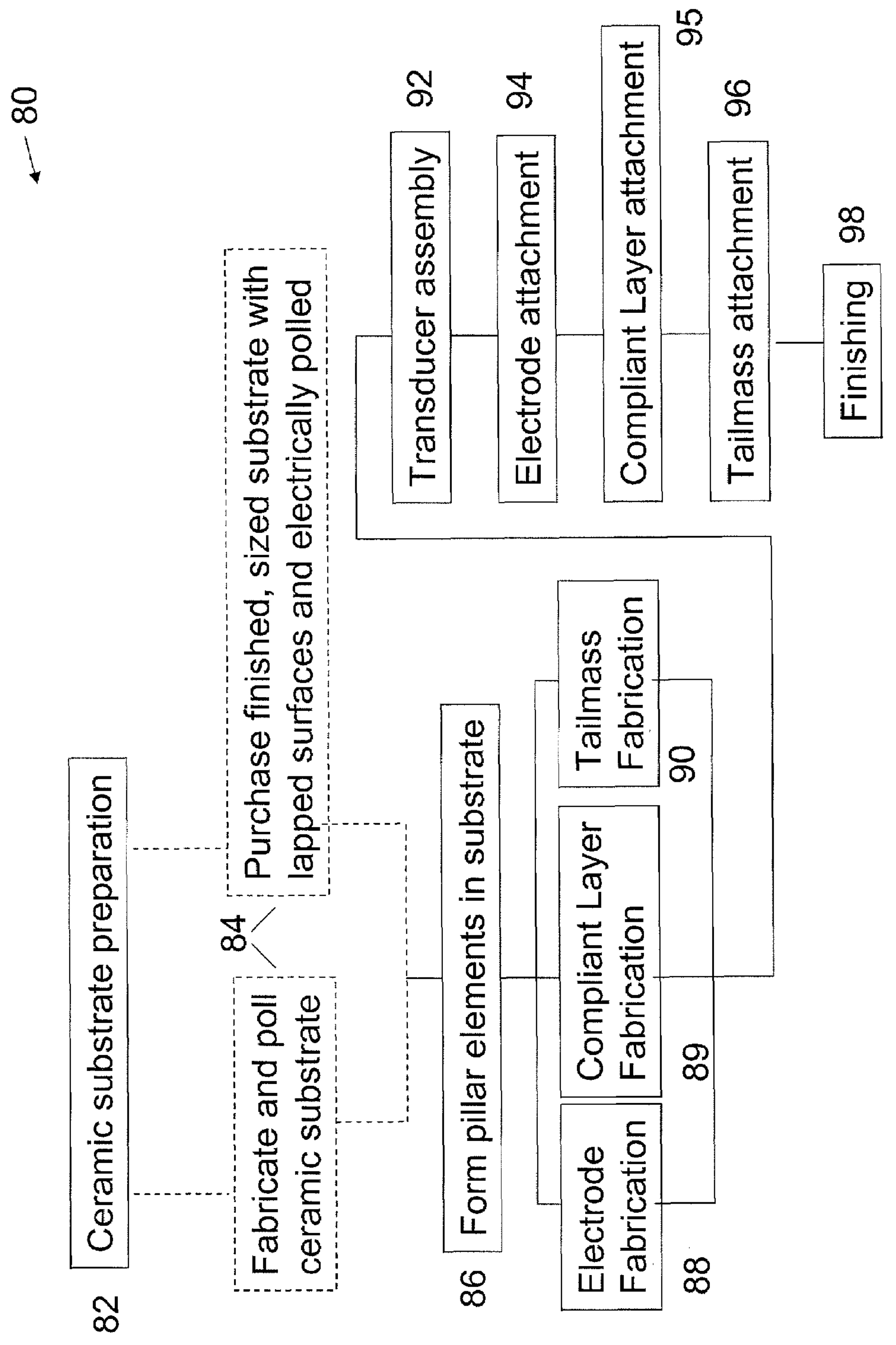
FIG. 10 is a process flowchart setting forth illustrative steps for making a hybrid transducer according to an embodiment of the invention.

FIG. 10 is a process flowchart 80 setting forth illustrative steps for making an exemplary hybrid transducer according to an embodiment of the invention. The process 80 for making a hybrid transducer according to an embodiment of the invention begins at step 82 with the preparation of the ceramic substrate. As shown at step 84, a suitable PZT substrate of desired size, thickness and electrical characteristics may be obtained from commercial sources. Alternatively, one may fabricate a custom substrate to obtain a maximum coupling coefficient, $d_{33}$ piezoelectric strain constant, or other particular characteristics. Using known methods and materials, a ceramic powder can be fabricated that is formable into a substrate. The ceramic powder may particularly be formed into plates of a specified "green" density and fired to remove binders in preparation for sintering. Special attention may be paid to environmental conditions during the sintering process to obtain the ceramic substrate having the desired ceramic density and a fine microstructure. To obtain adequate strength in small cross section pillar elements, as well as improved acoustic performance, a low defect PZT composition is advantageous. Once the substrate is fired, the plates can be ground to the exact desired thickness using, for example, a Hoffman PR1 lapper with LVDT depth control. Tight control over material flatness ensures uniform stress distribution in the material, especially when the transducer is subjected to high pressure loading as seen, in an exemplary instance, during deep ocean operation. To make electrical connections to the ceramic, silver electrodes may be screen printed onto the lapped plates and dried. The plates can then be electrically polarized in the $x_{33}$ direction typically at several thousand volts. Once a suitable piezoceramic substrate has been obtained, the individual pillar elements can be formed as shown at step 86. In an exemplary aspect, a Thermocarbon, Inc. automated dicing machine, or equivalent, can be used to cut the substrate to the desired transducer footprint size. It may be possible and desirable to obtain a plurality of finished, cubic or other shaped elements from a single substrate plate. A water cooled diamond saw blade can be used to produce a grid of ceramic pillars in the plate. This can be accomplished by multiple evenly spaced linear cuts in one direction followed by a set of similar cuts perpendicular to the first set. At step 88, two electrodes are used to form the conductive path from the ceramic element and its silver electrodes to wire leads. As known to those skilled in the art, beryllium copper alloys are advantageous materials for electrode fabrication in transducers. A compliant layer made of G10 fiberglass, FR4, or other similar material to be inserted between the tailmass and the PZT is cut at step 89. In addition to providing electrical isolation of the assembly from the tailmass, the compliant layer facilitates stress relief in the pillars when operating at extreme pressures. Also, as known by those skilled in the art, in relatively thicker proportions, this compliant layer can also be used as a mechanical tuning element and to improve the transducer bandwidth when operating in a resonant mode. In this aspect, careful attention to design is required so that transducer coupling is not adversely affected. At step 90, a tailmass is fabricated. The tailmass provides structural support to the pillars and high acoustic impedance, thereby enhancing transducer directionality and resistance to crosstalk. In an exemplary aspect, the tailmass can be machined from high density tungsten rod or bar stock and shaped appropriately. At step 92, the transducer is assembled from the ceramic element, the compliant layer, the tailmass, and two electrodes. The electrodes are prepared for bonding at step 94 and are attached to the top and bottom of each diced ceramic element using silver based conductive epoxy such as Chomerics Cho-Bond 584 adhesive. The compliant layer is prepped for bonding and attached to the bottom electrode at step 95. The same conductive epoxy used to attach the electrodes may be used; however, if electrical isolation from the tailmass is desired, care must be taken to ensure that excess epoxy does not compromise the electrode to tailmass gap created by the compliant layer. At step 96, the tailmass is abraded and cleaned in a manner similar to the electrodes. It can then be attached to the compliant layer using epoxy. The transducer is finished at step 98 by attaching a wire to each of the two electrodes. The positive lead is generally soldered to the top electrode prior to the electrodes' adhesion to the ceramic element. This increases mechanical integrity of the wire to electrode bond and reduces the ceramic's exposure to potentially depolarizing, high-temperature, soldering operations. In an alternative aspect, one may forgo the top electrode in favor of a direct solder connection. In this aspect, a short-duration soldering operation using high silver content solder is preferred. In another aspect, a compliant layer is attached to the top (or headmass) electrode as well as being inserted between the bottom electrode and the tailmass. As known to those skilled in the art, this can provide an impedance matching layer that acts as an efficient acoustic transformer to improve energy transfer between the transducer and the propagation medium. An additional advantage provided by the upper compliant layer realized in the current embodiment is impact protection for the ceramic headmass. In another particular aspect, the transducer is assembled without the compliant layer between the tailmass and the bottom electrode. While the effects of electrically coupling the tailmass to the ceramic have to be taken into account, the bottom electrode can be eliminated, simplifying construction. Accordingly, there is a decrease in epoxy thickness in the assembly and a corresponding reduction in coupling loss. Once the transducer is fully assembled, excess epoxy can be removed by scrapping, grinding, or other means. Final curing and ceramic stabilization can then be completed. After curing and stabilization, the transducer's electrical properties can be measured. Among others, these properties include capacitance, dissipation, frequencies of maximum and minimum admittance, and effective piezoelectric strain constant. Recognizing the inter-relationship between piezoelectric constants, and that an increasing value of one parameter may result in a decrease to another, readily obtainable properties for ceramic material in a particular embodiment includes piezoelectric strain constant $d_{33}>650\times10^{-12}$ m/V, piezoelectric voltage constant $g_{33}>22\times10^{-3}$ Vm/N, relative free dielectric constant $K^T_{33}>3200$, and dielectric loss tangent (tan $\delta$)<0.020. As stated earlier, low-defect material consistent with these properties is commercially available.

As is apparent to those skilled in the art, an exemplary aspect of the invention is the effective removal of transverse coupling in the device and the consequential benefits to performance. In an aspect of the invention wherein the transducer is employed as a hydrophone, it is known that the product of the piezoelectric hydrostatic strain constant, $d_h$, with the piezoelectric voltage constant, $g_h$, can be used to define a figure of merit for simple hydrophones. Additionally, equivalent figures of merit such as the $\in^T_{33}*g_h^2$ product and the loss-density-volume-corrected $g_hd_h$ product can be used to aid in designing hydrophones with improved performance. Accordingly, one can define a simple block hydrophone and use the well-known conventions for the volume coefficients such as $g_h=2g_{31}+g_{33}$, or $d_h=2d_{31}+d_{33}$ to obtain a figure of merit. For typical piezoelectric materials in a block hydrophone, the $g_{31}$ and $d_{31}$ constants are negative and when multiplied by 2, tend to cancel the $g_{33}$ and $d_{33}$ constants thus resulting in small values of $g_h$ and $d_h$ and poor hydrophone figures of merit. Haun et el. U.S. Pat. No. 4,728,845 discloses that an effective nullification of the $g_{31}$ and $d_{31}$ constants can be obtained thus greatly increasing the $g_hd_h$ figure of merit and the potential performance in hydrophone applications. Haun et al. further discloses that a low dielectric constant is desired so that the hydrophone material may have a large voltage coefficient $g_h$ and correspondingly high figure of merit. Subsequently, Haun et al. chooses a lower dielectric material such as PZT-4 ceramic and maximizes the $g_hd_h$ figure of merit. Similarly, in Cui et al. U.S. Pat. Nos. 5,702,629 and 5,951,908, the $g_hd_h$/tan $\delta$ loss-corrected figure of merit is emphasized and its implications on the material dielectric and strain constants. As a result, a cylindrical hydrophone is constructed by Cui et al. with the goal of maximizing the $g_hd_h$/tan $\delta$ figure of merit. Despite the mathematical equivalence to the $g_hd_h$ figure of merit, it is instructive to consider the $\in^T_{33}*g_h^2$ product. This product then suggests the choice of high dielectric material such as the PZT-5H type embodied in the present invention. As stated earlier, the high dielectric material enables much smaller sensor configurations and correspondingly higher sensor array design frequencies through better impedance matching to associated pre-amplification electronics. In one embodiment of the hybrid transducer, a hydrophone has been constructed using high dielectric material where the $g_hd_h$ and loss-corrected $g_hd_h$ figures of merit exceed the values presented in Cui et al. Furthermore, the particular hydrophone exhibits equivalent sensitivity, but is smaller in size, and has more practical values of capacitance required to match to amplification electronics. In this embodiment, a hydrophone is constructed using the earlier detailed description with the following specific dimensions: Ceramic element outer dimensions of 6.35 mm by 6.35 mm by 6.68 mm with twenty five 0.762 mm uniformly distributed square ceramic pillars that are formed within. Electrodes consisting of 0.33 mm thick FR4 circuit board cut into 6.35 mm square pieces. A tailmass machined from tungsten rod into a square pyramidal frustum with a 6.35 mm square base, a 4.57 mm square top, and a 3.1 mm height. Effective properties of the completed hydrophone include electromechanical coupling coefficient k>0.62, relative dielectric coefficient $K_{33}=1150$, tan $\delta=0.025$, $g_h=63\times10^{-3}$ Vm/N, and $d_h=640\times10^{-12}$. From these values, unusually high hydrophone figures of merit result. When encapsulated in a suitable housing, measured in-water sensitivities of assembled hydrophones correlate to within 1 dB of values calculated using the stated parameters using typical hydrophone geometrical dimensions that will be apparent to those skilled in the art. Consistent results are obtained in the hydrostatic mode below resonance, while operating near resonance has been shown to increase sensitivity by more than 10 dB. Pressure tolerance has been demonstrated to over 2500 psi with the normally expected shifts in certain piezoelectric properties observed at very high stress levels within the ceramic.

According to a particular aspect, a sensor array may be fabricated by suitably assembling a plurality of the individual hybrid transducers described herein above.

The foregoing description of the embodiments of the invention have been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A hybrid transducer, comprising:

a tailmass; and a diced ceramic element having an active base structure and a plurality of integral pillar elements in spaced relation extending from the base structure, wherein the base structure functions as a headmass, further wherein each pillar element has an end region coupled to the tailmass, further wherein one of only a gaseous medium and a vacuum occupies the space intermediate the pillar elements.

2. The hybrid transducer of claim 1, wherein a depth of the space intermediate the plurality of pillar elements is between about 75% to 98% of a total thickness of the active material.

3. The hybrid transducer of claim 1, wherein the ratio of a thickness of a non-pillared region of the diced ceramic structure and a depth of the space intermediate the plurality of pillar elements and is between 0.1 to 0.7.

4. The hybrid transducer of claim 1, wherein the plurality of pillar elements is in a grid formation.

5. The hybrid transducer of claim 1, wherein the plurality of pillar elements form at least a 2×3 grid.

6. The hybrid transducer of claim 1, wherein the plurality of pillar elements form a square grid having at least 3×3 elements.

7. The hybrid transducer of claim 1, wherein the diced ceramic structure is a high dielectric PZT-5H type ceramic material.

8. The hybrid transducer of claim 1, wherein the diced ceramic structure is a high density, low porosity type piezoelectric or electrostrictive ceramic material.

9. The hybrid transducer of claim 1, wherein the diced ceramic structure is one of a standard density and porosity piezoelectric or electrostrictive ceramic material.

10. The hybrid transducer of claim 1, wherein the plurality of pillar elements is greater than four pillar elements.

11. The hybrid transducer of claim 1, wherein each of the plurality of pillar elements has a cross sectional area in the range between about 0.010 to 50 square inches.

12. The hybrid transducer of claim 1, wherein the plurality of pillar elements are equally spaced.

13. The hybrid transducer of claim 1, wherein the plurality of pillar elements are cemented to the tailmass.

14. The hybrid transducer of claim 1, wherein the diced ceramic structure comprises electrodes coupled to opposite ends thereof.

15. The hybrid transducer of claim 1, wherein the tailmass is one of steel or tungsten.

16. The hybrid transducer of claim 1, wherein each of the plurality of pillar elements has a square cross section.

17. The hybrid transducer of claim 1, wherein each of the plurality of pillar elements has an arcuate cross section.

18. The hybrid transducer of claim 1, wherein each of the plurality of pillar elements has a circularly symmetric cross section.

19. A method of making a hybrid transducer, comprising:

providing an active material consisting of a low defect, high dielectric type of Lead Zirconate Titanate ceramic having selected dimensions;

forming a plurality of pillar elements in spaced relation in the active material; and attaching a tailmass to a free end region of the plurality of pillar elements, wherein no solid or liquid material is provided intermediate the plurality of pillar elements.

20. The method of claim 19, forming the plurality of pillar elements by cutting the active material.

21. The method of claim 19, forming the plurality of pillar elements by an injection molding process.

22. The method of claim 19, providing electrical connections to the active material.

23. The method of claim 19, providing a high dielectric PZT-5H type ceramic material as the active material.

24. The method of claim 19, providing a piezoelectric or electrostrictive ceramic as the active material.

25. The method of claim 19, further providing electrical polarization of the active material in the $x_3$ dimension.

26. The method of claim 19, wherein forming a plurality of pillar elements in spaced relation in the active material comprising a square grid of at least a 3×3 array of pillar elements.

27. The method of claim 19, wherein forming a plurality of pillar elements in spaced relation in the active material comprising a rectangular grid of at least a 2×3 array of pillar elements.

28. The method of claim 19, wherein forming a plurality of pillar elements in spaced relation in the active material comprising a circular grid of pillar elements.

29. The method of claim 19, further forming a sensor array by assembling a plurality of the hybrid transducers.

* * * * *